(12) United States Patent
Chuman et al.

(10) Patent No.: US 7,189,480 B2
(45) Date of Patent: Mar. 13, 2007

(54) MASK USED FOR LAYER FORMATION AND PROCESS OF MAKING THE MASK

(75) Inventors: Takashi Chuman, Tsurugashima (JP); Yoshihiko Uchida, Tsurugashima (JP); Hideo Satoh, Tsurugashima (JP); Takuya Hata, Tsurugashima (JP); Atsushi Yoshizawa, Trusugashima (JP)

(73) Assignee: Pioneer Corporation, Tokyo (JP)

( * ) Notice: Subject to any disclaimer, the term of this patent is extended or adjusted under 35 U.S.C. 154(b) by 366 days.

(21) Appl. No.: 10/750,975

(22) Filed: Jan. 5, 2004

(65) Prior Publication Data

US 2004/0144317 A1     Jul. 29, 2004

(30) Foreign Application Priority Data

Jan. 24, 2003   (JP) .............................. 2003-015935

(51) Int. Cl.
  *G03F 1/00*   (2006.01)
  *G03C 5/00*   (2006.01)
(52) U.S. Cl. .......................... 430/5; 430/296
(58) Field of Classification Search ................ 430/5, 430/30, 296; 716/21
  See application file for complete search history.

(56) References Cited

U.S. PATENT DOCUMENTS

| 3,241,519 A | 3/1966 | Lloyd |
| 6,316,151 B1 * | 11/2001 | Kim et al. ................... 430/5 |
| 6,855,467 B2 * | 2/2005 | Amemiya ................... 430/30 |

FOREIGN PATENT DOCUMENTS

| EP | 0 580 112 A1 | 1/1994 |
| JP | 10-305670 A | 11/1998 |

OTHER PUBLICATIONS

Patent Abstracts of Japan, vol. 1999, No. 3, Mar. 31, 1999, which corresponds to JP 10-315 648 A dated Dec. 2, 1998.

* cited by examiner

*Primary Examiner*—S. Rosasco
(74) *Attorney, Agent, or Firm*—Sughrue Mion, PLLC

(57) ABSTRACT

A mask assembly includes a frame and at least one linear element secured onto the frame. The linear elements define a masking part. The masking part has at least one opening. The openings are made by removing predetermined linear elements from those secured to the frame.

9 Claims, 5 Drawing Sheets

MASK USED FOR LAYER FORMATION AND PROCESS OF MAKING THE MASK

BACKGROUND OF THE INVENTION

1. Field of the Invention

The present invention relates to a mask used when forming a thin layer on a substrate, and a process of fabricating the mask.

2. Description of the Related Art

Vapor deposition, sputtering, CVD and similar processes are used to form thin layers from various kinds of material. The thin layers are shaped to a certain pattern or configuration, depending upon a purpose of use. If the vapor deposition process is performed with a mask having a fine opening pattern, the vapor deposition process can make a thin layer having a desired pattern.

In this vapor deposition process, the mask is firmly attached to a substrate prior to vapor deposition. The material is then vapor-deposited on the substrate. The opening of the mask decides (controls) the area of vapor deposition so that a desired pattern of thin layer is made on the substrate. The mask is prepared by, for example, electroforming.

The process of making the mask by electroforming will be described. First, a plating substrate with photoresist thereon is prepared, and a fine pattern of resist is made on the substrate by photolithography (i.e., the pattern making process). As a result, some areas are covered with the resist and other areas are not on the substrate. Then, a metal is electro-deposited over the no resist areas on the plating substrate (i.e., the electroforming process). After the electroforming, the deposited metallic layer is removed from the substrate (i.e., the peeling or exfoliating process). The peeled metallic layer becomes the mask which has the opening of the same shape as the resist pattern.

In this manner, the mask has the opening that has a uniform width is prepared. This technique is disclosed in Japanese Patent Kokai No. 10-305670.

The mask is thin so that the mask is easy to bend. Particularly, the mask bends as the mask becomes larger. If the mask bends during the layer forming process, the opening of the mask changes its shape so that the resulting layer does not have a desired pattern.

SUMMARY OF THE INVENTION

According to one aspect of the present invention, there is provided an improved mask assembly having a predetermined opening pattern used to form a thin layer having the same pattern on a substrate. The mask assembly includes a frame having a window. The mask assembly also includes a masking part supported by an edge (periphery) of the window such that the masking part spans (bridges) the window of the frame. The masking part includes a plurality of shielding portions spaced from each other to form the predetermined opening pattern. Each shielding portion has at least one linear element. The shielding portion may have a plurality of parallel linear elements arranged next to each other.

According to another aspect of the present invention, there is provided a method of making a mask assembly. The mask assembly has a predetermined opening pattern used to form a thin layer of the same pattern on a substrate. The method includes providing a masking part that includes a plurality of linear elements arranged next to each other. The method also includes removing predetermined one or more linear elements to form the predetermined opening pattern. Since which linear element(s) should be removed can be determined arbitrarily, it is possible to make the opening having a desired pattern.

Other objects, aspects and advantages of the present invention will become apparent to those skilled in the art to which the present invention pertains from the subsequent detailed description of the invention and the appended claims, taken in conjunction with the accompanying drawings.

DETAILED DESCRIPTION OF THE INVENTION

A mask assembly according to various embodiments of the present invention will be described with reference to the accompanying drawings.

Figure 1:
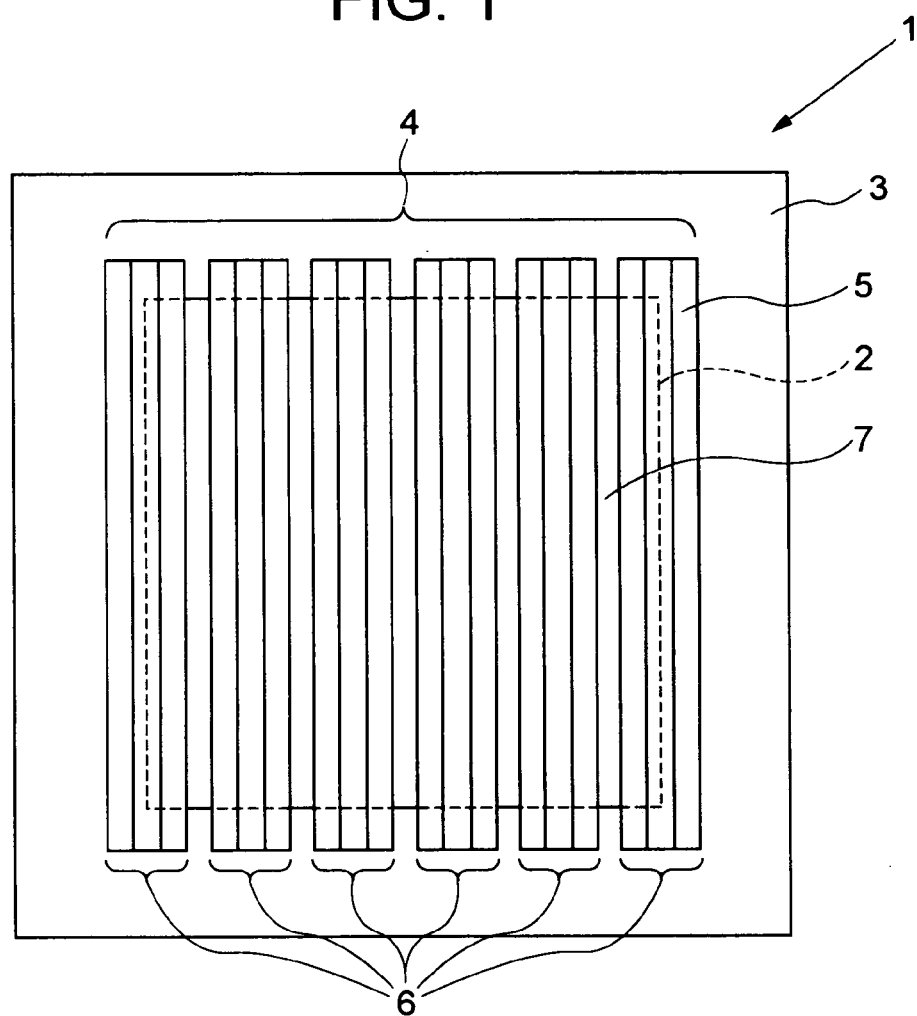
FIG. 1 illustrates a plan view of a mask assembly used for layer formation according to one embodiment of the present invention.

Referring to FIG. 1, a mask assembly 1 used for layer formation includes a rectangular frame 3 having a rectangular window 2. The frame 3 is a rigid plate member made from, for instance, SUS430 (stainless steel). The frame 3 supports a masking portion 4 on the edge of the window 2. The masking portion 4 is firmly attached to the frame 3 by means of adhesive or other connecting element (not shown). The masking portion 4 generally spans the window 2.

The masking portion 4 includes a plurality of shielding (masking) parts 6. Each shielding part 6 includes a plurality of parallel linear elements 5 arranged next to each other. The linear element 5 is a resin wire having a 10-micrometer diameter. It should be noted that three linear elements 5 form a single shielding part 6 in FIG. 1, but this is for the sake of easy illustration. In actuality, the shielding part 6 includes more linear elements 5. Ends of the linear elements 5 are located on the edge of the window 2 of the frame 3.

The shielding parts 6 are spaced from each other. The shielding parts 6 and the window 2 in combination define a plurality of rectangular openings 7.

The mask assembly 1 is used for vapor deposition (layer formation). In a vapor deposition machine, the mask assembly 1 is placed such that the frame 3 faces a substrate across the masking portion 4. A vapor deposition material is supplied from the frame side and passes through the openings 7 to reach the substrate. The material then becomes a thin layer having a certain pattern, which is determined by the openings 7, on the substrate. Such vapor deposition process can make, for example, a bus line for organic electro luminescent elements and/or other parts.

Figure 2:
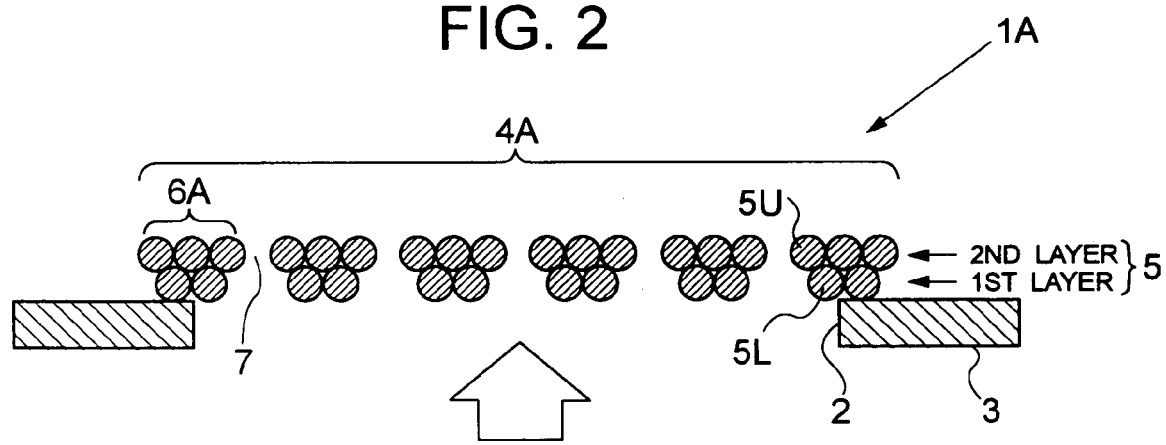
FIG. 2 illustrates a cross sectional view of a modified mask assembly according to the present invention.

It should be noted that the linear elements 5 may be stacked in the thickness direction of the frame 3 or mask assembly 1 (i.e., the direction perpendicular to the drawing sheet of FIG. 1) so that the masking part has a multi-layer structure. An example of a masking assembly having a multi-layer masking part is illustrated in FIG. 2. In FIG. 2, the linear elements 5 (5U, 5L) of each shielding part 6A have a two-layer structure. The lower layer is indicated as the "first layer" and the upper layer is indicated as the "second layer." The linear elements 5L of the lower layer are directly placed on the frame 3, and the linear elements 5U of the upper layer are put on the lower linear elements 5L. In FIG. 2, each lower linear element 5L is located below the connecting line of two adjacent upper linear elements 5U. Since each lower linear element 5L seals a gap between the associated two upper linear elements 5U, the vapor deposition material supplied, as indicated by the unshaded arrow, does not pass the gaps between the upper linear elements 5U. The vapor deposition material flows through the openings 7 only. The multi-layer masking portion 4A includes a plurality of multi-layer shielding parts 6A to define the modified masking assembly 1A.

Figure 3:
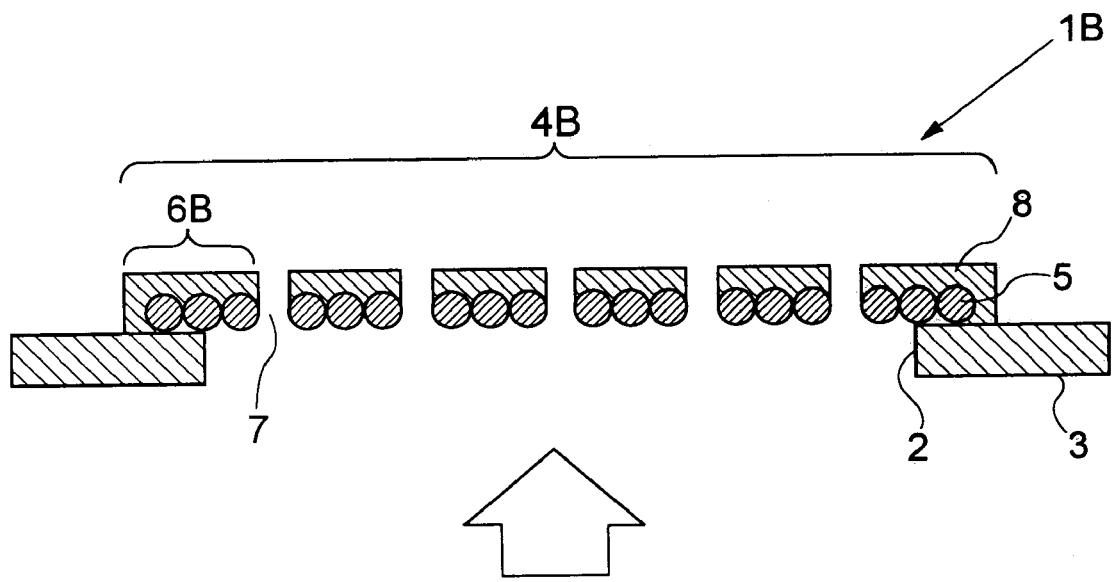
FIG. 3 illustrates a cross sectional view of another modified mask assembly.

Referring to FIG. 3, another masking assembly 1B is illustrated. The masking assembly 1B includes a plurality of modified shielding parts 6B. Each shielding part 6B includes a coating layer 8 that covers the linear elements 5. The coating layer 8 seals a gap between each two adjacent linear elements 5. Thus, the vapor deposition material (unshaded arrow) does not pass the gaps of the linear elements 5. The resulting masking portion is designated at 4B.

Figure 4:
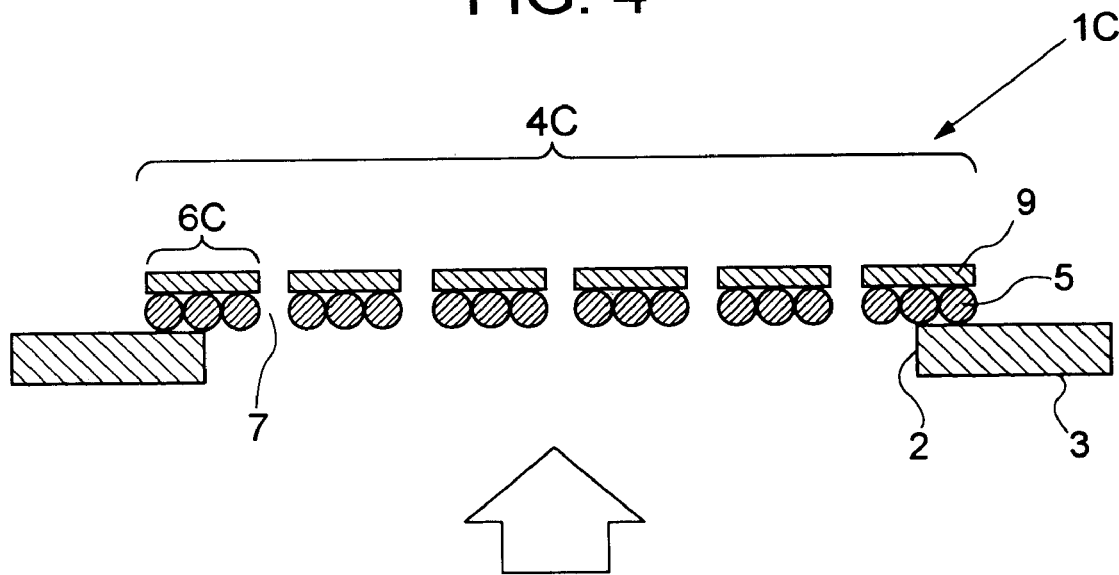
FIG. 4 illustrates a cross sectional view of still another modified mask assembly.

Instead of the coating layer 8, a suitable film may be employed. As shown in FIG. 4, a film 9 may be attached over the linear elements 5 of each shielding part 6C. The resulting masking portion is designated at 4C, and the resulting masking assembly is designated at 1C.

Now, a process of making the mask assembly will be described.

Figure 5A:
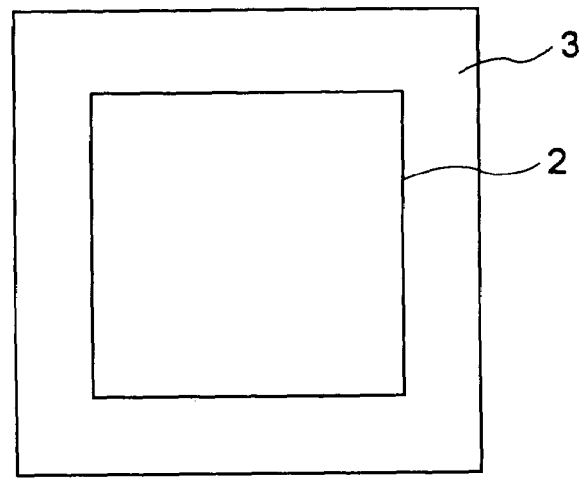
FIGS. 5A to 5C are a set of plan views to illustrate a method of fabricating the mask assembly shown in FIG. 1.

Firstly, referring to FIG. 5A, the frame 3 having the window 2 is prepared. Then, the linear elements 5 are provided on the frame 3 to completely close the window 2 as indicated at 4' in FIG. 5B.

The parallel linear elements 5 are arranged close to each other and firmly attached to the frame 3 by an adhesive or other suitable connector. Arranging and attaching the linear elements 5 may be performed simultaneously or successively. Alternatively, arranging a certain number of linear elements 5, followed by the attaching process, may be repeated until the linear elements 5 close the entire window 2 of the frame 3.

Tension is applied to the linear elements 5 when the linear elements 5 are attached to the frame 3. Therefore, the linear elements 5 (or the mask portion 4') which span the window 2 do not bend or become loose.

Figure 5B:
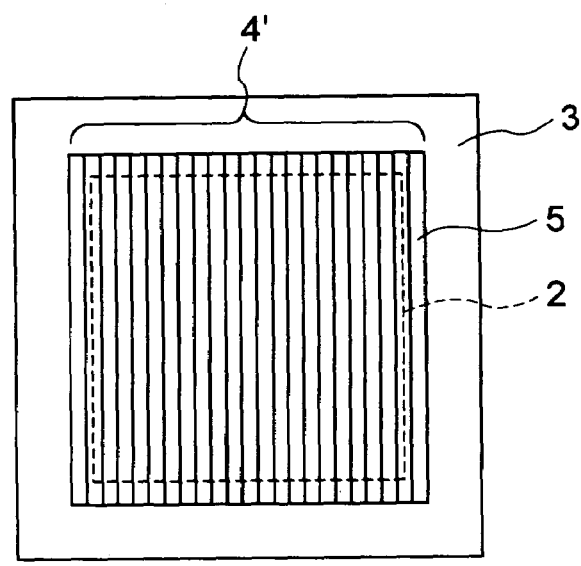
Figure 5C:
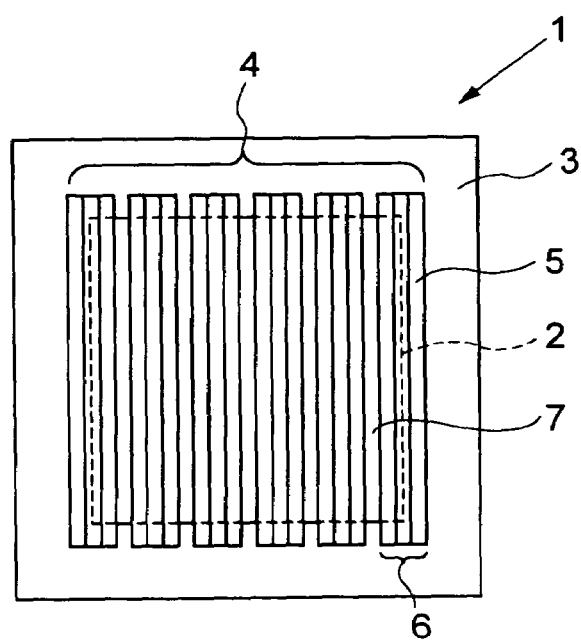

After the mask portion 4' is fixed to the frame 3, at least one linear element 5 is removed to form the opening(s) 7 as shown in FIG. 5C. The width of each opening 7 is determined by the number of the removed linear elements 5 and the diameter of each linear element. Accordingly, it is possible to arbitrarily determine the size (width) of each opening 7. It is also possible to arbitrarily determine the location of each opening 7.

If the linear elements 5 are stacked, the processes of FIGS. 5B and 5C are repeated. For example, when the mask shown in FIG. 2 is fabricated, the lower layer of linear elements 5L are laid on the frame 3, some of the lower linear elements 5L are removed, and then the upper layer of linear elements 5U are laid over the lower linear elements 5L, and some of the upper linear elements 5U are removed to form the openings 7.

It should be noted that, as shown in FIG. 3, coating layers 8 may be provided over the linear elements 5 to seal gaps of adjacent linear elements 5, before or after the process of FIG. 5C. The coating layers 8 may be formed by vapor-depositing a resin on the linear elements 5. This will be described with reference to FIGS. 6A and 6B.

Figure 6A:
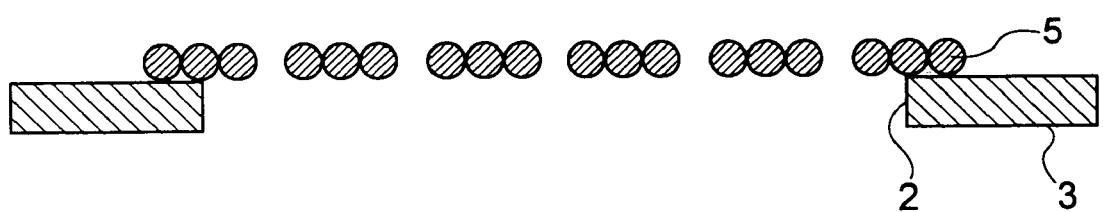
FIGS. 6A and 6B are a set of cross sectional views to illustrate a method of fabricating the mask assembly shown in FIG. 3.
Figure 6B:
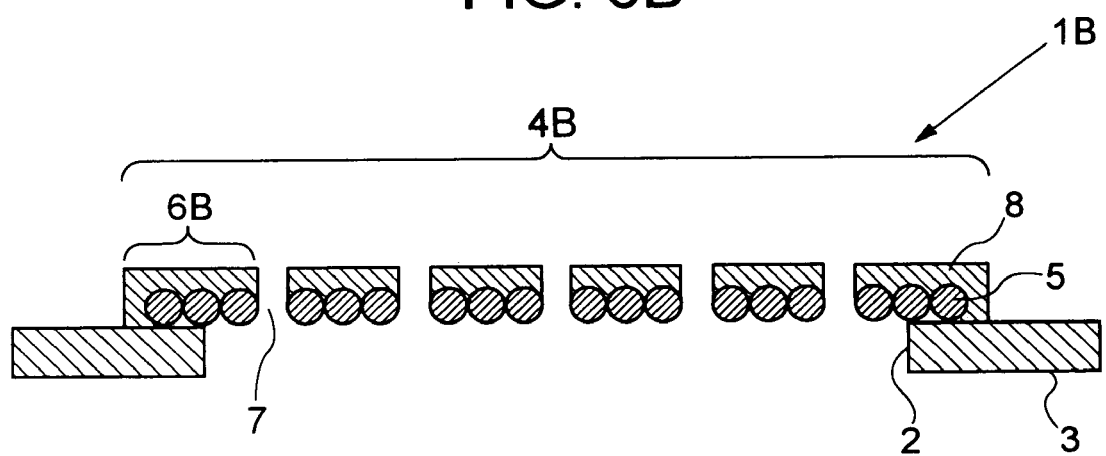

When the predetermined linear elements are removed and the openings 7 are formed as shown in FIG. 6A, the coating layers 8 are formed over the remaining linear elements 5 as shown in FIG. 6B. This is an example when the coating layers 8 are formed after the process of FIG. 5C.

Alternatively, if the coating layer formation is performed before the process of FIG. 5C (i.e., if the coating layers 8 are formed over all the linear elements 5), the coating layers 8 applied onto the unnecessary linear elements 5 are removed together with the unnecessary linear elements 5 when the unnecessary linear elements 5 are removed.

It should also be noted that, as shown in FIG. 4, films 9 may be provided over the linear elements 5 to seal gaps of adjacent linear elements 5. The films 9 may be attached to the linear elements 5 by an adhesive. This will be described with reference to FIGS. 7A to 7D.

Figure 7A:
FIGS. 7A to 7D are a set of cross sectional views to illustrate a method of fabricating the mask assembly shown in FIG. 4.
Figure 7B:

First, the linear elements 5 are arranged side by side as shown in FIG. 7A. Then, the film 9 is applied to the linear elements 5 as shown in FIG. 7B. The film 9 is, for example, a metallic foil, and is attached to the linear elements 5 by a suitable adhesive.

Figure 7C:
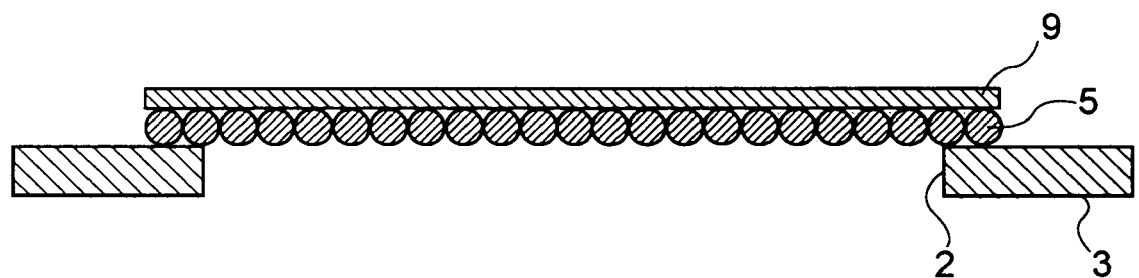
Figure 7D:
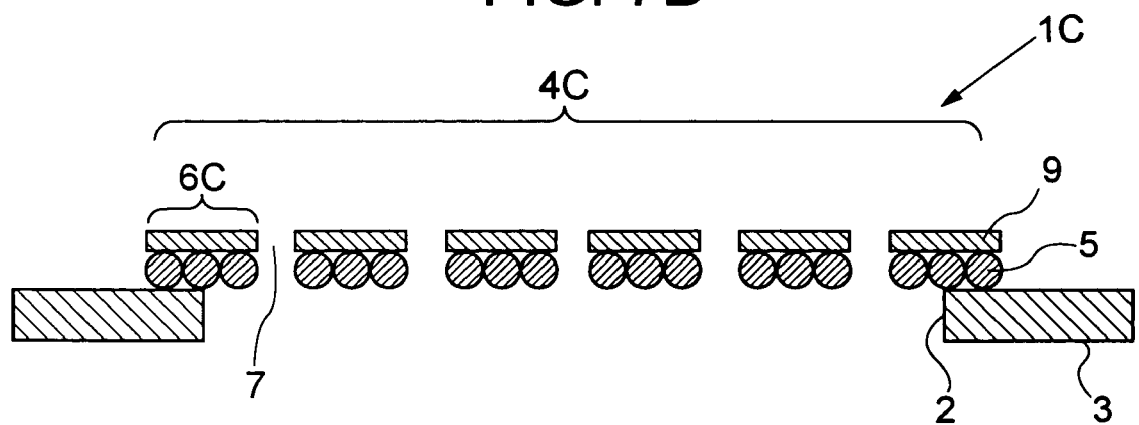

Subsequently, the linear elements 5, together with the film 9, are firmly secured on the frame 3 as shown in FIG. 7C. Then, predetermined linear elements 5 are removed to form the openings 7 as shown in FIG. 7D. When the unnecessary linear elements 5 are removed, the associated film is also removed. As a result, the mask 1C is prepared.

It should be noted that the linear element 5 is circle in the cross sectional shape in the foregoing description, but the present invention is not limited in this regard. For instance, the linear element 5 may be polygonal in the cross sectional shape.

All the linear elements 5 may not be made from a single material. For example, if the linear elements 5 are categorized into "unnecessary" or "to be removed" elements and "necessary" or "to remain" elements, the "to be removed" elements may be made from an acid-corrosive material and the "to remain" elements may be made from an acid-resistive material. The "to be removed" elements are those linear elements which are removed in the process of FIG. 5C to form the openings 7. The frame 3 may also be made from the acid-resistive material. In this case, the process of FIG. 5C to remove the unnecessary linear elements can be performed by immersing all the linear elements together with the frame 3 (FIG. 5B) in an acid pool (not shown).

If the linear elements 5 and frame 3 deform upon heating, the linear elements 5 may be fused and fixed to the frame 3 by heating. In this case, no fixing agent such as an adhesive is needed to connect the linear elements 5 onto the frame 3.

The shape and location of the window 2 and the shape of the frame 3 are not limited to those illustrated and described. For instance, the window 2 may have any suitable polygonal shape.

This application is based on a Japanese patent application No. 2003-15935, and the entire disclosure thereof is incorporated herein by reference.

What is claimed is:

1. A mask assembly having a predetermined opening pattern used to form a thin layer having the same pattern on a substrate, comprising:
   a frame having a window, the window having an edge; and
   a masking part supported by the edge of the window, the masking part consisting of a plurality of linear wire elements spaced from each other to form the predetermined opening pattern.

2. The mask assembly according to claim 1, wherein the plurality of linear wire elements are arranged in parallel to each other.

3. The mask assembly according to claim 2, wherein the plurality of linear wire elements are arranged in a plurality of layers.

4. The mask assembly according to claim 3, wherein the plurality of layers includes an upper layer and a lower layer, and the linear wire elements of the lower layer are arranged to seal gaps between the linear wire elements of the upper layer.

5. The mask assembly device according to claim 1, wherein the predetermined opening pattern is made by removing predetermined one or more linear elements.

6. The mask assembly according to claim 1, further comprising a coating member to cover at least one said linear wire element.

7. The mask assembly according to claim 1, further comprising a film member to cover at least one said linear wire element.

8. The mask assembly according to claim 1, wherein each of the plurality of linear wire elements is made from an acid-resistive material.

9. The mask assembly according to claim 1, wherein each of the plurality of linear wire elements is a resin wire.

* * * * *